United States Patent [19]
Philofsky et al.

[11] 4,451,845
[45] May 29, 1984

[54] LEAD FRAME DEVICE INCLUDING CERAMIC ENCAPSULATED CAPACITOR AND IC CHIP

[75] Inventors: Elliott Philofsky, Myrtle Beach, S.C.; Ward Parkinson; Dennis Wilson, both of Boise, Id.

[73] Assignee: AVX Corporation, Great Neck, N.Y.

[21] Appl. No.: 333,411

[22] Filed: Dec. 22, 1981

[51] Int. Cl.³ ............... H01L 23/28; H01L 27/02; H01L 23/48; H01L 23/16
[52] U.S. Cl. ............................ 357/72; 357/51; 357/70; 357/75; 357/80
[58] Field of Search ............... 357/75, 70, 72, 80, 357/51

[56] References Cited
U.S. PATENT DOCUMENTS
3,500,066  3/1970  Pritchett ................. 357/75 X
3,617,817  11/1971  Kawakatsu et al. ........ 357/80 X
3,846,823  11/1974  Matthews et al. ......... 357/75 X Primary Examiner—Martin H. Edlow
Assistant Examiner—J. L. Badgett
Attorney, Agent, or Firm—Arthur B. Colvin

[57] ABSTRACT

The present invention is directed to an IC device of the ceramic encapsulated type wherein a power supply pulse dampening capacitor is embodied within the IC housing. The device is characterized by the utilization of a chip capacitor bonded to the floor of a recess formed within the housing, which capacitor forms a platform supporting the IC device. Leads between the capacitor and the power supply terminals of the circuit may be maintained at extremely short lengths, whereby inductances are minimized and relatively small capacitors effectively damp power supply pulses.

3 Claims, 5 Drawing Figures

LEAD FRAME DEVICE INCLUDING CERAMIC ENCAPSULATED CAPACITOR AND IC CHIP

BACKGROUND OF THE INVENTION

1. Field of the Invention

The present invention is in the field of integrated circuit (IC) devices and pertains more particularly to an IC device of the type employing a molded ceramic encapsulating container.

This application is a continuation-in-part of application, Ser. No. 224,127, filed Jan. 12, 1981, and entitled Integrated Circuit Device and Sub-Assembly.

2. The Prior Art

IC devices find frequent application as components of memory circuits in computers and the like as well as in a wide variety of other electronic apparatus where compactness and dependability are desired.

It is known that the activation of switching circuits within ICs generate pulses which are transmitted through the power supply, which power supply is also linked with memory circuits of other IC devices. Where pulses of a sufficient magnitude are transmitted to a second IC device or to an alternate circuit on a given IC device, the pulses may trigger false readings. Such false readings are referred to in the industry as "soft error."

In order to minimize the transmission of pulses throughout alternate circuit paths, it is known to shunt the power supply of IC devices with a capacitor, which shunting capacitor acts to dampen or minimize ringing or pulse transmission.

It has been determined that the length of leads in the shunting circuit, e.g. between the capacitor and the IC device connected to the power supply, has a profound effect on the amount of capacitance necessary to achieve satisfactory dampening. The longer the lead, the greater the inductive reactance of the dampening circuit and, consequently, the larger of value of capacitance necessary to effect dampening.

In devices heretofore known, e.g. in the memory devices of computers, conventional practice has employed capacitors externally of the IC device, with the consequence that substantial conductor lengths have been required to couple the ICs and capacitors. Thus, relatively high capacitances have been employed to offset the necessarily long lead lengths. The use of large capacitance, in addition to the expense factor, has mandated a wastage of space since often the size of the capacitor necessary to effect dampening is equal to or greater than the size of the IC itself.

In order to achieve compactness, it has been suggested to embody a capacitor directly within the IC device. A lead frame assembly and capacitor employing such concept is disclosed in copending application Ser. No. 224,127 filed Jan. 12, 1981.

Other structures wherein attempts have been made to provide an IC device having an associated capacitor include by way of example, U.S. Pat. Nos. 4,023,198, 4,105,475, 4,168,507, 4,208,698 and 4,249,196 and Japanese specification No. 53-121329.

It is also known to provide as an IC package, an exterior component having a cavity within which the IC chip is contained, such structure being shown, by way of example, in U.S. Pat. No. 3,697,666.

SUMMARY OF THE INVENTION

The present invention may be summarized as directed to an improved IC device, and more particularly to an improvement of devices of the type wherein an IC component, e.g. a silicon chip having a multiplicity of circuits therein, is encapsulated in a surrounding package, such as a ceramic enclosure.

In accordance with the invention there is provided a ceramic enclosure comprised of a bottom shell half and a top half which optionally but preferably is likewise in the form of a shell, at least the bottom half, and preferably also the top half being recessed. A chip capacitor is mounted in the recess and forms the floor of the lower shell half.

The IC device is bonded to the upper surface of the capacitor. Connections are effected between the power supply terminals of the IC chip and terminations of the capacitor whereby the capacitor is shunted across the power supply terminals of the chip.

Due to the proximity of the noted parts, the lead length of the connectors between power supply terminals and capacitor may be maintained at a very short length, enabling the provision of a circuit having a very low inductance. Due to the low value of the inductance, switching pulses transmitted to the power supply may be effectively dampened with a very low value capacitor. The value of the capacitor may be so low as not to increase the overall size of the IC device as compared with conventional IC devices, whereby great compactness may be achieved.

Accordingly, it is an object of the invention to provide an improved IC device of the type having a ceramic enclosure.

A further object of the invention is the provision of an improved IC device of the type described, housed within a ceramic enclosure comprising a bottom half having a recess, to the floor of which is mounted a capacitor, which defines a platform for mounting the IC device per se. Internal lead connections are effected between the capacitor and the power supply terminals of the IC device, said terminals being likewise connected to conductor portions of a lead frame device bonded to the ceramic enclosure. Alternatively, in lieu of a lead frame, the conductor portions may be screened onto the ceramic capacitor enclosure.

Thereafter, a second shell of ceramic is bonded to the first shell whereby there is provided a ceramic encased IC.

By virtue of the proximity of the capacitor and IC, the leads between the power supply terminals of the IC and the terminations of the capacitor are maintained at a very short length, whereby effective dampening is achieved with minimal capacitance.

To attain these objects and such further objects as may appear herein or be hereafter pointed out, reference is made to the accompanying drawings forming a part hereof in which.

Figure 1:
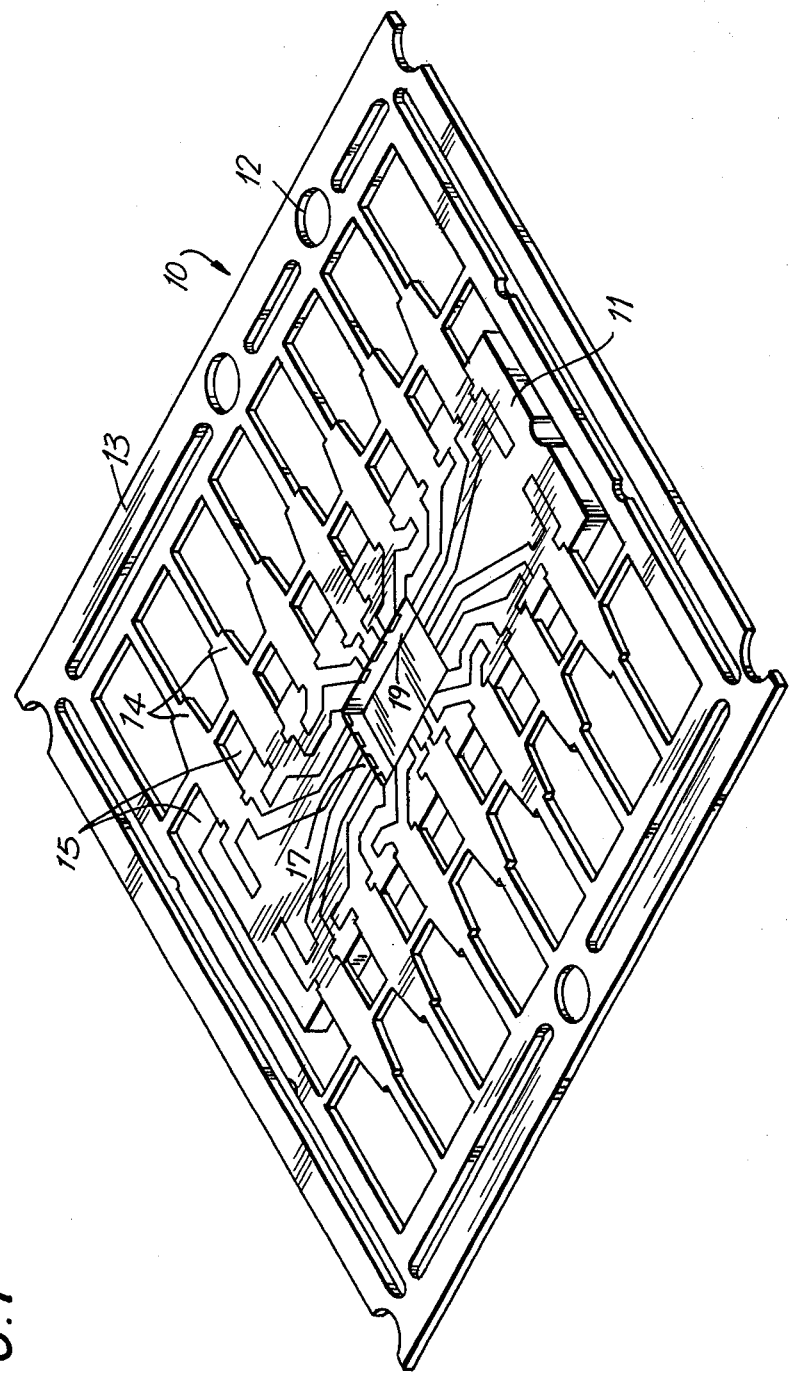
FIG. 1 is perspective view of a lead frame subassembly mounted to a portion of a ceramic housing.
Figure 2:
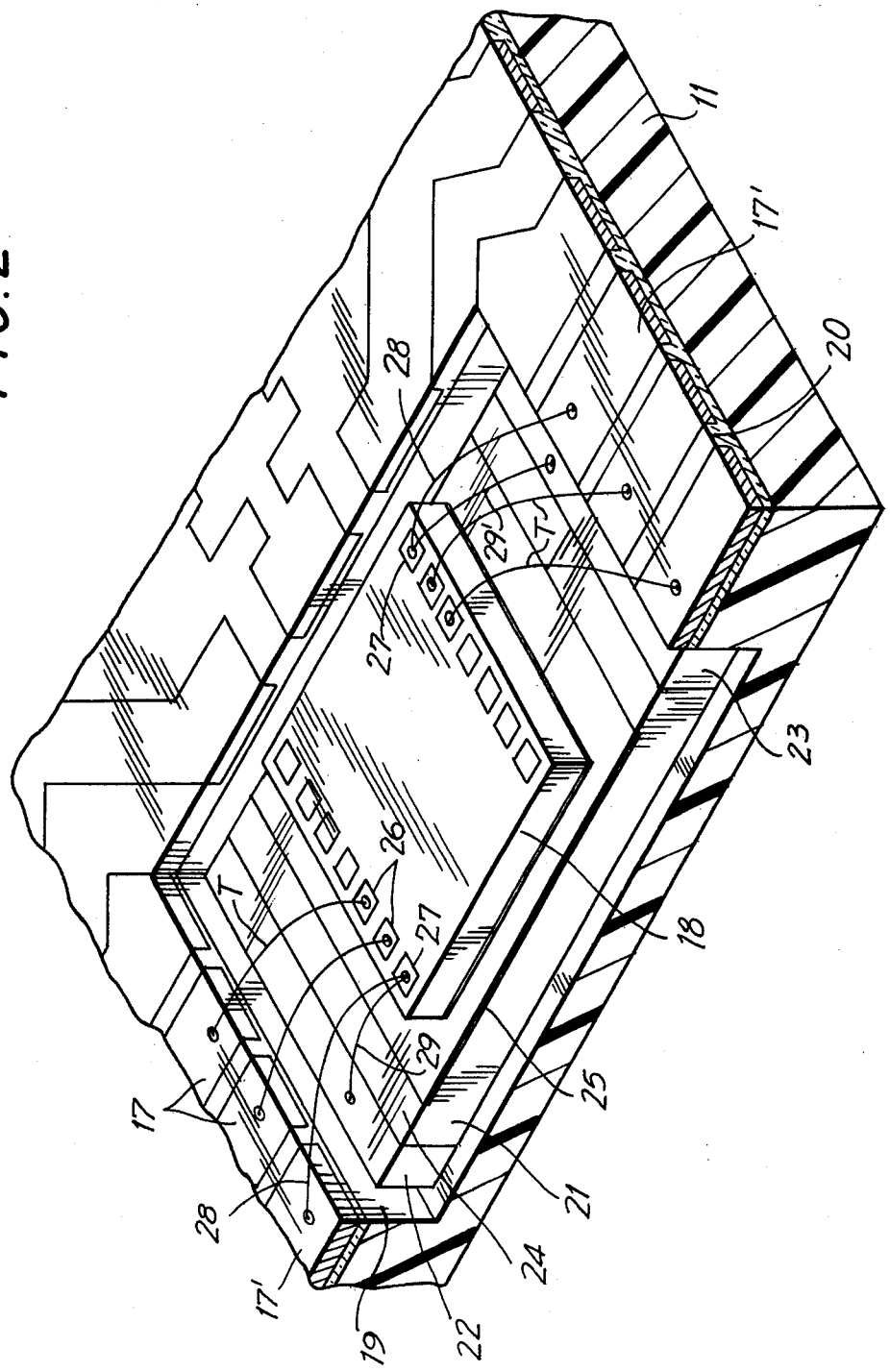
FIG. 2 is a fragmentary magnified plan view of the components of FIG. 1 at an advanced stage of fabrication.

Turning now to the drawings, there is shown in FIG. 1 components of an IC device in accordance with the invention, namely an increment, of an elongate web or latticework 10 of metal forming a lead frame, and a bottom shell half 11 of ceramic for enclosing and integrated circuit device. It will be understood that the lead frame section 10 constitutes a portion of an elongate web provided with indexing apertures 12 enabling the web to be fed and processed by automated machinery for carrying out the operations hereinafter described.

Since the lead frame per se and the automated machinery for feeding the same form no part of the present invention and are well known in the art, a detailed discussion thereof need not be undertaken. It is sufficient to note that the lead frame 10 includes a border portion 13 and a multiplicity of conductor members 14 separated by blanked out or stamped out areas 15, whereby the conductor members 14 provide conductive paths, the outer ends of which form contact portions 16, FIG. 3, and the inner ends 17 of which are adapted to be connected to terminals of an IC chip 18.

As shown in FIG. 1, the ceramic shell 11 includes a central recess area 19. The inner ends of conductors 17 define boundaries of the recess area 19. Preferably the lead frame 10 is bonded to the ceramic shell 11 by being embedded into a layer 20 of low melting point glass such that the upper ends of the layer of glass and the upper surfaces of conductors 17 are essentially in coplanar alignment. The attachment of the lead frame in the manner aforesaid through the use of a low melting point glass layer in which the frame becomes embedded is per se conventional practice, see for instance previously cited U.S. Pat. No. 3,697,666.

A ceramic capacitor member 21 is mounted in the recess 19 in the ceramic shell 11, which mounting may be effected either by a low melting point glass layer (not shown) or by an equivalent heat resistant bond. The capacitor 21 includes terminations 22, 23 which are electrically connected to the alternate electrode layers of the capacitor, as is conventional.

The upper surface 24 of the capacitor has bonded thereto the under surface portion of an IC chip 18.

In the illustrative embodiment shown the upper surface 24 of the capacitor first has bonded thereto a centrally located layer 25 of silver, gold or like metal. Preferably the layer 25 is formed by applying to the upper surface 24 a mixture of metal and glass frit and heating the same in situ, whereby there is formed a strongly adherent layer.

The chip 18 may be bonded to the capacitor 21 by interposing between the metal layer 25 of the capacitor and the under surface of the chip a solder preform. After heating, the solder melts, securely bonding the IC chip to the capacitor.

It will be understood that alternate bonding methods for supporting the chip on the capacitor may be employed, it merely being required that the bond be resistant to the heating steps forming a part of the ensuing procedures.

The IC chip includes a multiplicity of internal circuits (not shown), access to which circuits is provided by terminals 26.

Terminals 27, 27 constitute the power supply terminals of the chip 18. Connectors 28,28 in the nature of short lengths of jumper material span the distance between the power supply input conductors 17', 17' of the lead frame and the inputs 27, 27 of the IC chip.

In order to provide connection between the terminations of the capacitor 21 and the power supply terminals 27, 27 of the chip, a second pair of jumper connectors 29, 29' is formed between the terminations 22 and 23, respectively of the capacitor and the terminals 27,27 of the IC chip, respectively.

Connections T are effected between other respective conductors of the lead frame and the other terminals of the chip in a manner known per se.

Figure 4:
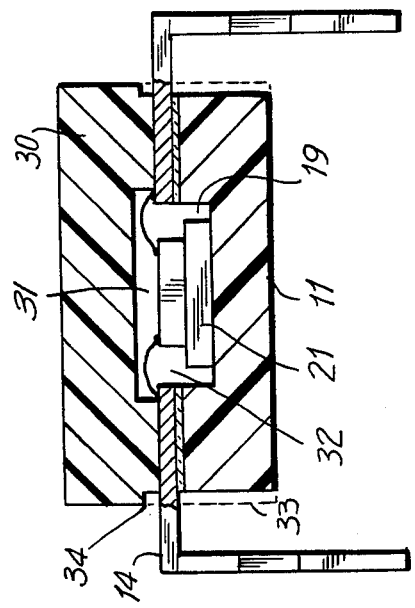
FIG. 4 is a vertical section taken on the line 4—4 of FIG. 3.

Assembly of the chip is completed by placing upper ceramic shell half 30 over the previously described lower shell half assembly. The upper shell half 30, FIG. 4, may include a recess 31 in registry with the recess 19 in the lower shell half whereby there is defined a chamber 32 between the shell halves, providing clearance for the jumper connectors T,28, 29 etc.

The upper shell half 30 is bonded to the lower shell half 11 to achieve a hermetically sealed environment. Preferably the bond may be formed by placing the lower shell half 11 within a preform 33 which is rectangular in plan and which provides spaced clearances for the projecting connectors portions 14 of the lead frame.

The preform 33, which is formed of a lead based glass which devitrifies at low temperatures, e.g. 460° C., extends to a level 34 slightly above, (e.g. about 5 mils) the level of the upper surface of the conductors 14.

The outer periphery of the upper shell half which is preferably larger than the outer periphery of the lower shell half, is seated on the uppermost edge of the surrounding preform. A weight is applied to the upper shell half and the composite is subjected to devitrifying temperatures, with the result that the preform will melt and fuse with the material of the upper shell half and into any interstices surrounding the projecting conductors 14, to define an impervious, hermetically sealed enclosure for the IC device.

Figure 3:
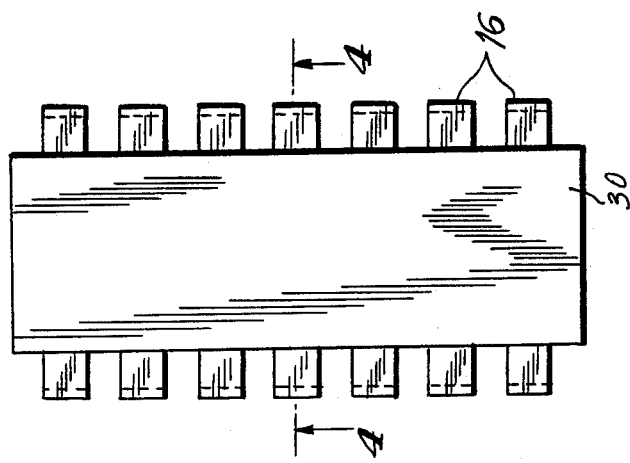
FIG. 3 is a top plan view of a completed IC device in accordance with the invention.

As is known, the conductor members 14 are bent essentially at right angles to the original plane of the lead frame and the metallic components of the lead frame spanning adjacent conductors are removed, whereby there is formed the IC device as depicted in FIG. 3.

Figure 5:
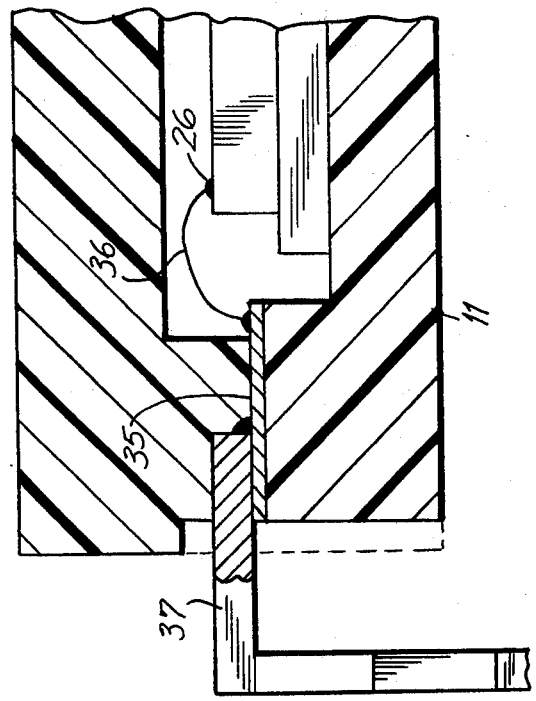
FIG. 5 is a magnified section similar to the section of FIG. 4, showing a further embodiment of the invention.

In FIG. 5, wherein like parts have been given like numerals, there is shown a similar IC device. The device of FIG. 5 differs from the embodiment previously described in that instead of the lead frame extending all the way to the chamber 32, the discrete conductors 35 are screened onto the lower shell half 11.

In such embodiment jumpers 36 extend between the conductors 35 and the terminals 26. External connections to the conductors 35 are afforded by a separate series of metallic members 37, which may themselves form increments of a subsequently severed metallic web.

From the preceding description it will be apparent that there is provided in accordance with the invention a ceramic encapsulated IC device characterized in that a ceramic chip capacitor is encapsulated within a ceramic enclosure, the capacitor forming a support for the IC device and in that short jumper connectors are effected between the power supply terminals of the IC chip and the terminations of the capacitor. In view of the very short length of the jumper connectors, there is a minimal addition of inductive reactance added to the circuit, whereby dampening of pulses generated by switching circuits within the IC chip may be effectively accomplished, notwithstanding the relatively small value of the capacitor.

The finished IC device has the same exterior dimensions as IC devices heretofore known.

By providing an internal capacitance, the necessity for utilizing bulky external capacitors of high value is eliminated.

As will be apparent to those skilled in the art and familiarized with the instant disclosure, numerous variations in details of construction may be made without departing from the spirit of the invention. Accordingly, the same is to be broadly construed within the scope of the appended claims.

The embodiments of the invention in which an exclusive property or privilege is claimed are defined as follows:

1. As a new article of manufacture, an integrated circuit device comprising a ceramic container including a lower shell half having a perimetral upper surface surrounding an upwardly facing central recess area and an upper shell half having a downwardly facing central recess area registering with the recess area of said lower shell half, said shell halves being bonded together along a planar parting line coincident with said upper surface of said lower shell half and together defining a chamber having a floor portion in said lower shell half, a ceramic chip capacitor bonded to said floor portion of said chamber, said capacitor including an upper surface portion and end terminations, an IC chip having an undersurface portion bonded to said upper surface portion of said capacitor, said chip including a pair of power supply input terminals, each said terminal being in proximate spaced relation to a respective one of said end terminations, a plurality of mutually spaced planar conductor members forming elements of an elongate lead frame sub-assembly interposed between said shells at said planar parting line, said conductor members being bonded to said upper surface of said lower shell half by a layer of low temperature melting insulating compound, the spaces between said conductor members being filled with increments of said insulating compound whereby the upper surface of said compound and the upper surfaces of said conductor members are in substantially co-planar alignment, said conductor members having inner end portions defining border portions of the said chamber and having outer end portions extending externally of said container, a first pair of connectors disposed within said chamber, each extending between a respective one of said power supply input terminals and end terminations, and a second pair of connectors within said chamber, each connecting one of said power supply input terminals with a different one of said conductor members.

2. An integrated circuit device in accordance with claim 1 wherein said layer of insulating compound comprises glass.

3. An integrated circuit device in accordance with claim 1 wherein said bond between said upper surface portion of said capacitor and said under surface of said IC chip is formed by a metallic layer secured to said upper surface portion, a solder connection being provided between said metallic layer and the undersurface of said IC chip.

* * * * *